US011730021B2

(12) United States Patent
Sung et al.

(10) Patent No.: US 11,730,021 B2
(45) Date of Patent: Aug. 15, 2023

(54) DISPLAY DEVICE AND METHOD OF MANUFACTURING THE SAME

(71) Applicant: Samsung Display Co., Ltd., Yongin-Si (KR)

(72) Inventors: Wooyong Sung, Yongin-si (KR); Jaesik Kim, Yongin-si (KR); Jaeik Kim, Yongin-si (KR); Yeonhwa Lee, Yongin-si (KR); Joongu Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/871,128

(22) Filed: Jul. 22, 2022

(65) Prior Publication Data

US 2022/0359630 A1     Nov. 10, 2022

Related U.S. Application Data

(62) Division of application No. 16/868,493, filed on May 6, 2020, now Pat. No. 11,430,842.

(30) Foreign Application Priority Data

Oct. 30, 2019     (KR) .................. 10-2019-0136899

(51) Int. Cl.
  *H10K 59/122*     (2023.01)
  *H10K 71/00*      (2023.01)
  *H10K 102/10*     (2023.01)

(52) U.S. Cl.
  CPC .......... *H10K 59/122* (2023.02); *H10K 71/00* (2023.02); *H10K 2102/103* (2023.02)

(58) Field of Classification Search
  None
  See application file for complete search history.

(56) References Cited

U.S. PATENT DOCUMENTS 8,913,170 B1    12/2014   Baldwin
9,412,802 B2 *   8/2016   Hyun ................... H10K 59/131
9,806,262 B2    10/2017   Kwon et al.
(Continued)

FOREIGN PATENT DOCUMENTS

KR    10-2017-0020652 A    2/2017
KR    10-2017-0055074 A    5/2017
(Continued)

*Primary Examiner* — Michelle Mandala
(74) *Attorney, Agent, or Firm* — Innovation Counsel LLP

(57) ABSTRACT

To provide a display device having a reduced non-display area, the display device including: a substrate including a display area, the display area including a first area and a second area; a first pixel electrode in the first area, and a second pixel electrode in the second area; a pixel-defining layer on the substrate and including a first opening and a second opening, the first opening exposing at least a portion of the first pixel electrode, and the second opening exposing at least a portion of the second pixel electrode; a first intermediate layer on the at least a portion of the first pixel electrode, and a second intermediate layer on the at least a portion of the second pixel electrode; a first opposite electrode on the first intermediate layer; and a second opposite electrode on the first opposite electrode and the second intermediate layer.

6 Claims, 16 Drawing Sheets

(56) References Cited

U.S. PATENT DOCUMENTS

| | | | |
|---|---|---|---|
| 10,205,122 B2 | 2/2019 | Choi et al. | |
| 10,236,328 B2 | 3/2019 | Kim et al. | |
| 10,403,859 B2 | 9/2019 | Lee et al. | |
| 2016/0190389 A1* | 6/2016 | Lee | A61B 5/0075 |
| | | | 438/28 |
| 2016/0343787 A1 | 11/2016 | Wu | |
| 2017/0150618 A1 | 5/2017 | Choi et al. | |
| 2017/0365812 A1* | 12/2017 | Choung | H10K 50/11 |
| 2020/0161391 A1 | 5/2020 | Zhang et al. | |
| 2021/0226170 A1 | 7/2021 | Kong et al. | |
| 2021/0327965 A1 | 10/2021 | He | |
| 2021/0335915 A1 | 10/2021 | Qin et al. | |

FOREIGN PATENT DOCUMENTS

| | | | |
|---|---|---|---|
| KR | 10-2017-0059527 A | 5/2017 | |
| KR | 10-2017-0059864 A | 5/2017 | |
| KR | 10-2018-0108948 A | 10/2018 | |
| KR | 10-2019-0061464 A | 6/2019 | |

* cited by examiner

DISPLAY DEVICE AND METHOD OF MANUFACTURING THE SAME

CROSS-REFERENCE TO RELATED APPLICATION

This application is a divisional application of U.S. patent application Ser. No. 16/868,493 filed on May 6, 2020, which claims priority to and the benefit of Korean Patent Application No. 10-2019-0136899, filed on Oct. 30, 2019, in the Korean Intellectual Property Office, the disclosure of the Korean Patent Application which is incorporated herein in its entirety by reference.

BACKGROUND

1. Field

The technical field relates to a display device and a method of manufacturing the same.

2. Description of Related Art

In recent years, the purposes of display devices have been broadening. As display devices become thinner and more lightweight, their range of use has continued to diversify.

Devices that may be combined or associated with display devices are increasing. Since display devices are used in various ways, their shapes may be designed in various ways.

SUMMARY

With increasing functions of display devices, an embodiment may provide a display device including areas in which an optical element, a sensor, etc. may be arranged, inside a display area.

Additional aspects will be set forth in part in the description which follows and, in part, will be apparent from the description, or may be learned by practice of the presented embodiments of the disclosure.

According to one or more embodiments, a display device includes a substrate including a display area, the display area including a first area and a second area, a first pixel electrode in the first area, and a second pixel electrode in the second area, a pixel-defining layer on the substrate and including a first opening and a second opening, the first opening exposing at least a portion of the first pixel electrode, and the second opening exposing at least a portion of the second pixel electrode, a first intermediate layer on the at least a portion of the first pixel electrode, and a second intermediate layer on the at least a portion of the second pixel electrode, a first opposite electrode on the first intermediate layer, and a second opposite electrode on the first opposite electrode and the second intermediate layer.

The second opposite electrode may include a transparent conductive material.

The transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second opposite electrode may be in direct contact with on the first opposite electrode.

The first opposite electrode does not overlap the second intermediate layer.

The display device may further include an island electrode arranged on the second intermediate layer and exposing at least a portion of the second intermediate layer.

The second opposite electrode in direct contact with the island electrode.

The island electrode may not directly contact the first opposite electrode.

The display device may further include a hydrophobic layer arranged between the island electrode and the second intermediate layer.

The hydrophobic layer may include a self-assembled monolayer (SAM).

The first opening may have a first width, and the second opening may have a second width, the second opening being less than or equal to the first width.

The display device may further include a third pixel electrode in the second area, and a third intermediate layer on the third pixel electrode.

The first opposite electrode may extend toward the second area and be arranged on the third intermediate layer.

The second opposite electrode may be arranged on the first opposite electrode.

According to one or more embodiments, a method of manufacturing a display device includes preparing a substrate including a display area, the display area including a first area and a second area, forming a first pixel electrode in the first area, and a second pixel electrode in the second area, forming a pixel-defining layer including a first opening and a second opening, the first opening being in the first pixel electrode and exposing at least a portion of the first pixel electrode, and the second opening being in the second pixel electrode and exposing at least a portion of the second pixel electrode, forming a first intermediate layer on the at least a portion of the first pixel electrode, and a second intermediate layer on the at least a portion of the second pixel electrode, forming a hydrophobic layer on the second intermediate layer; forming a first opposite electrode on the first intermediate layer and the hydrophobic layer; removing the hydrophobic layer and the first opposite electrode on the hydrophobic layer; and forming a second opposite electrode on the first opposite electrode and the second intermediate layer.

The second opposite electrode may include a transparent conductive material.

The transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The forming of the second opposite electrode on the first opposite electrode may include forming the second opposite electrode directly on the first opposite electrode.

In the forming of the pixel-defining layer including the first opening and the second opening, the first opening may have a first width, and the second opening may have a second width, the second width being less than or equal to the first width.

The first opposite electrode may not be arranged on the second intermediate layer.

The above and other aspects, features, and advantages of certain embodiments of the disclosure will be more apparent from the following description, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
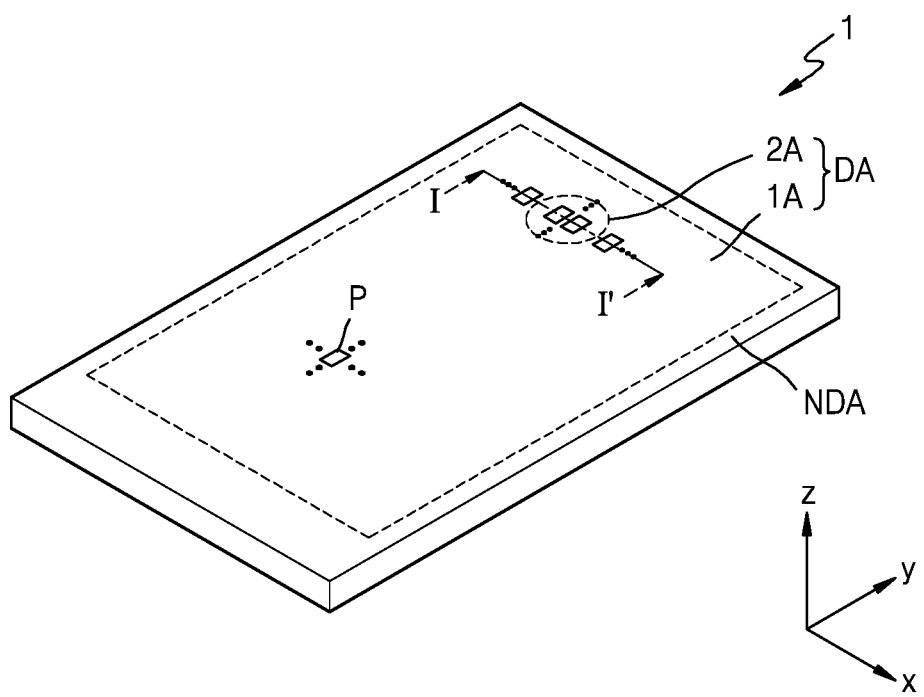
FIG. 1 is a perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in detail with reference to the accompanying drawings. In the drawings, the same reference numerals are given to the same or corresponding elements, and repeated description thereof is omitted.

Although the terms "first," "second," etc. may be used to describe various components, these components should not be limited by these terms. These terms are used to distinguish one component from another. A first component may be termed a second component without departing from teachings of one or more embodiments. The description of a component as a "first" component may not require or imply the presence of a second component or other components. The terms "first," "second," etc. may be used to differentiate different categories or sets of components. For conciseness, the terms "first," "second," etc. may represent "first-type (or first-set)," "second-type (or second-set)," etc., respectively. As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. When a first element is referred to as being "on" a second element, the first element can be directly or indirectly on the second element. One or more intervening elements may be present between the first element and the second element.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display device 1 according to an embodiment.

Referring to FIG. 1, the display device 1 includes a display area DA and a non-display area NDA. The display area DA may display an image, and the non-display area NDA may not display an image. The display area DA includes a first area 1A and a second area 2A. The display device 1 may provide an image by using light emitted from a plurality of pixels P arranged in the first area 1A and a plurality of pixels P arranged in the second area 2A. A component may be arranged below the second area 2A, the component including an optical element.

In embodiments, various types of display devices such as inorganic light-emitting displays and quantum dot light-emitting displays may be used. Hereinafter, the display device 1 according to embodiments is described as an organic light-emitting display device.

It is shown in FIG. 1 that the second area 2A is arranged on an upper portion of the display area DA, which has a quadrangular shape. In embodiments, the shape of the display area DA may be a circle, an ellipse, or a polygon such as a triangle, and the location and the number of second areas 2A may be in other parts of the display area DA than shown.

Figure 2:
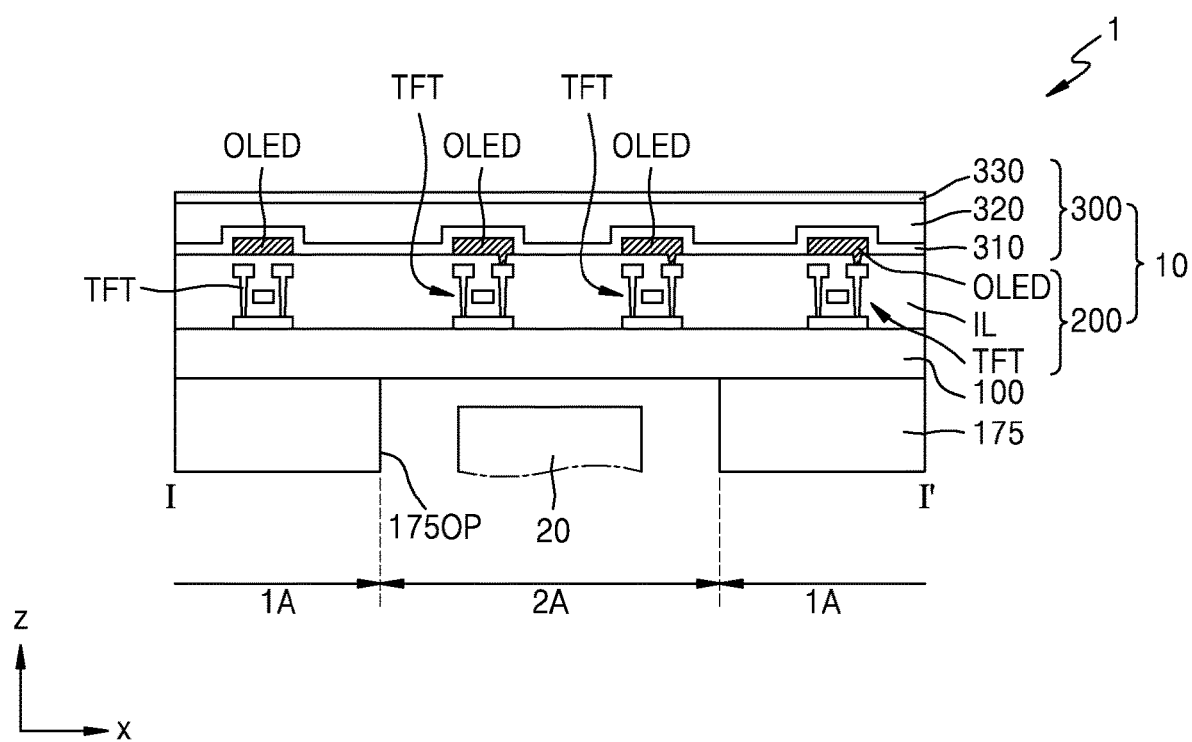
FIG. 2 is a cross-sectional view of a display device according to an embodiment.

FIG. 2 is a cross-sectional view of the display device 1 according to an embodiment.

Referring to FIG. 2, the display device 1 may include a display panel 10 and a component 20, where the display panel 10 includes a display element and the component 20 is located below the display panel 10 to correspond to the second area 2A. The display panel 10 may include a substrate 100, a display element layer 200 on the substrate 100, and a thin-film encapsulation layer 300 sealing the display element layer 200. Also, the display panel 10 may further include a bottom protective film 175 arranged under the substrate 100.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including the polymer resin and an inorganic layer (not shown) together in a layer.

The display element layer 200 may include a circuit layer, an organic light-emitting diode OLED as a display element, and an insulating layer IL between the circuit layer and the display element. The circuit layer including a thin film transistor TFT. A circuit layer and a pixel may be arranged in the first area 1A and the second area 2A. The circuit layer may include a thin film transistor TFT, and the pixel may include an organic light-emitting diode OLED as a display element. Wirings (not shown) connected to each pixel may be arranged in the first area 1A and the second area 2A.

The component 20 may be located in the second area 2A. The component 20 may include an electronic element, such as an optical element. For example, the component 20 may be a sensor such as an infrared sensor that emits and/or receives light, a sensor that outputs and senses light or sound to measure a distance or recognize a fingerprint, a small lamp that outputs light, or a speaker that outputs sound.

The thin-film encapsulation layer 300 may include at least one inorganic encapsulation layer and at least one organic encapsulation layer. With regard to this, FIG. 2 shows a first inorganic encapsulation layer 310, a second inorganic encapsulation layer 330, and an organic encapsulation layer 320 between the first and second inorganic encapsulation layers 310 and 330.

The first inorganic encapsulation layer 310 and the second inorganic encapsulation layer 330 may include at least one inorganic insulating material among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, an acrylic resin (e.g. polymethyl methacrylate, a polyacrylic acid, etc.), or an arbitrary combination of the listed materials.

The bottom protective film 175 may be attached under the substrate 100 to support and protect the substrate 100. The bottom protective film 175 may include polyethylene terephthalate or polyimide. The bottom protective film 175 may include an opening 1750P corresponding to the second area 2A. Since the opening 1750P is provided in the bottom protective film 175, a light transmittance of the second area 2A may be improved.

An area of the second area 2A may be greater than an area in which the component 20 is arranged. The area of the second area 2A may be equal to an area of the opening 1750P, or the area of the opening 1750P provided in the bottom protective film 175 may not be equal to the area of the second area 2A. A plurality of components 20 having different or the same functions may be arranged in the second area 2A.

Elements such as an input sensing member sensing a touch input, a reflection prevention member, and a transparent window may be further arranged on the display panel 10, the reflection prevention member including a polarizer, a retarder, or a color filter and a black matrix.

The thin-film encapsulation layer 300 may be used as an encapsulation member sealing the display element layer 200. For example, a sealing substrate that is attached to the substrate 100 by using sealant or frit may be used as a member sealing the display element layer 200.

Figure 3:
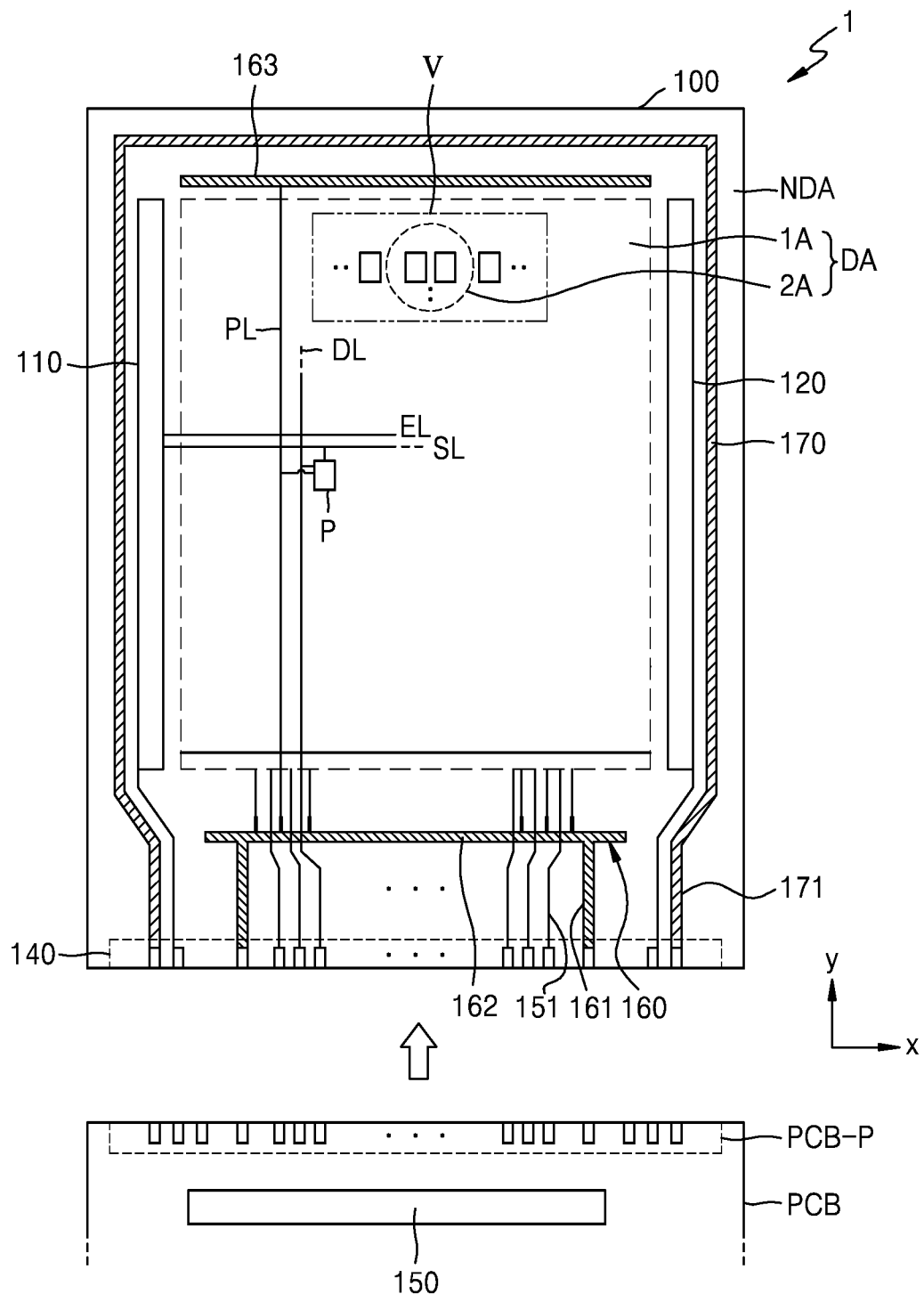
FIG. 3 is a plan view of a display device according to an embodiment.

FIG. 3 is a plan view of the display device 1 according to an embodiment.

Referring to FIG. 3, various kinds of elements constituting the display device 1 are arranged on the substrate 100. The substrate 100 includes the display area DA and the non-display area NDA surrounding the display area DA. The display area DA includes the first area 1A and the second area 2A. The display area DA may be protected from external air or moisture, etc. by the encapsulation layer 300.

Pixels P are arranged in the first area 1A and the second area 2A. Each pixel P may include a display element such as an organic light-emitting diode OLED. Each pixel P may emit, for example, red, green, blue, or white light from the organic light-emitting diode OLED. In the present specification, as described above, a pixel P may be a pixel emitting red, green, blue, or white light. At least one component 20 may be arranged below the second area 2A of the display device 1.

Each pixel P may be electrically connected to outer circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel P through a scan line SL. The first scan driving circuit 110 may provide an emission control signal to each pixel P through an emission control line EL. The second scan driving circuit 120 may be arranged in parallel to the first scan driving circuit 110 with the display area DA between. Some of the pixels P arranged in the display area DA may be electrically connected to the first scan driving circuit 110, and the rest of the pixels P may be connected to the second scan driving circuit 120.

A terminal 140 may be arranged on one side of the substrate 100. The terminal 140 may be exposed and electrically connected to a printed circuit board PCB since it is not covered by an insulating layer. A terminal PCB-P of the printed circuit board PCB may be electrically connected to the terminal 140 of the display device 1. The printed circuit board PCB is configured to transfer a signal of a controller (not shown) or power to the display device 1. Control signals generated by the controller may be respectively transferred to the first and second scan driving circuits 110 and 120 through the printed circuit board PCB. The controller may respectively provide first and second power voltages ELVDD and ELVSS (see FIGS. 4 and 5) to the first and second power supply lines 160 and 170 through first and second connection lines 161 and 171. The first power voltage ELVDD may be provided to each pixel P through a driving voltage line PL connected to the first power supply line 160, and the second power voltage ELVSS (also referred to as a common voltage) may be provided to an opposite electrode of each pixel P connected to the second power supply line 170.

The data driving circuit 150 may be electrically connected to the data line DL. A data signal of the data driving circuit 150 may be provided to each pixel P through a connection line 151 and the data line DL, the connection line 151 being connected to the terminal 140, and the data line DL being connected to the connection line 151. The data driving circuit 150 may be arranged on the printed circuit board PCB. In an embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 that are parallel to each other and extending in an x-direction with the display area DA between. The second power supply line 170 may have a loop shape having one open side and partially surround the display area DA.

Figure 4:
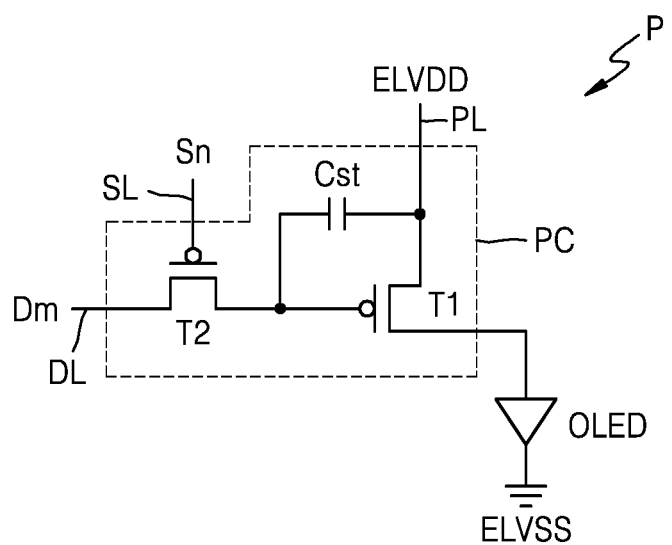
FIGS. 4 and 5 are equivalent circuit diagrams of a pixel that may be included in a display device according to an embodiment.
Figure 5:
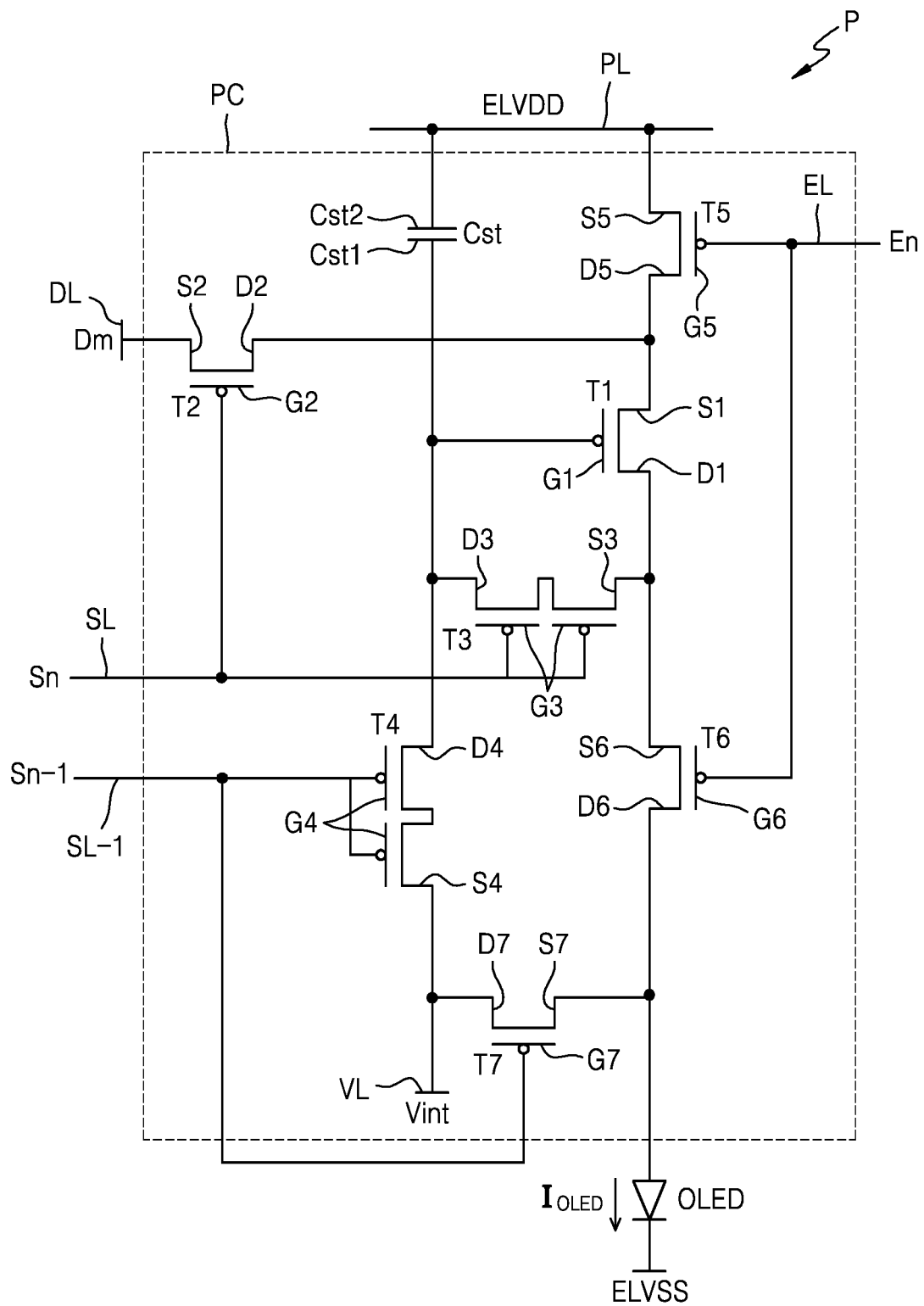

FIGS. 4 and 5 are equivalent circuit diagrams of a pixel that may be included in a display device according to an embodiment.

Referring to FIG. 4, a pixel circuit PC may include a driving thin film transistor T1, a switching thin film transistor T2, and a storage capacitor Cst. The switching thin film transistor T2 is connected to the scan line SL and the data line DL and may be configured to transfer a data signal Dm input through the data line DL to the driving thin film transistor T1, in response to a scan signal Sn input through the scan line SL.

The storage capacitor Cst is connected to the switching thin film transistor T2 and the driving voltage line PL and may store a voltage corresponding to a difference between a voltage transferred from the switching thin film transistor T2 and the first power voltage ELVDD (or a driving voltage) supplied to the driving voltage line PL.

The driving thin film transistor T1 is connected to the driving voltage line PL and the storage capacitor Cst and may, in response to the voltage stored in the storage capacitor Cst, control a driving current flowing through an organic light-emitting diode OLED from the driving voltage line PL. The organic light-emitting diode OLED may emit light having a predetermined brightness according to the driving current.

The pixel circuit PC may include two thin film transistors and one storage capacitor. As shown in FIG. 5, the pixel circuit PC may include seven thin film transistors and one storage capacitor. In an embodiment, the pixel circuit PC may include two or more storage capacitors.

Referring to FIG. 5, each pixel P includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and the driving voltage line PL.

A pixel P may be connected to the signal lines SL, SL-1, EL, and DL, the initialization voltage line VL, and the driving voltage line PL. In an embodiment, at least one of the signal lines SL, SL-1, EL, and DL, the initialization voltage line VL, and the driving voltage line PL may be shared by pixels that neighbor each other.

The signal lines include the scan line SL, the previous scan line SL-1, the emission control line EL, and the data line DL. The scan line SL may transfer a scan signal Sn, and the previous scan line SL-1 may transfer a previous scan signal Sn-1 to a first initialization thin film transistor T4 and a second initialization thin film transistor T7. The emission control line EL may transfer an emission control signal En to an operation control thin film transistor T5 and an emission control thin film transistor T6, and the data line DL intersects with the scan line SL and may transfer a data signal Dm. The driving voltage line PL may transfer the driving voltage ELVDD to the driving thin film transistor T1, and the initialization voltage line VL may transfer an initialization voltage Vint initializing the driving thin film transistor T1 and a pixel electrode of an organic light-emitting diode OLED.

A driving gate electrode G1 of the driving thin film transistor T1 is connected to a bottom electrode Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of the organic light-emitting diode OLED through the emission control thin film transistor T6. The driving thin film transistor T1 may receive a data signal Dm depending on a switching operation of a switching thin film transistor T2 and supply a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and may perform a switching operation of transferring a data signal Dm transferred through the data line DL to the driving source electrode S1 of the driving thin film transistor T1.

A compensation gate electrode G3 of a compensation thin film transistor T3 is connected to the scan line SL, and a compensation source electrode S3 of the compensation thin film transistor T3 is connected to the driving drain electrode D1 of the driving thin film transistor T1 and simultaneously connected to the pixel electrode of the organic light-emitting diode OLED through the emission control thin film transistor T6. A compensation drain electrode D3 of the compensation thin film transistor T3 is connected to the bottom electrode Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and may diode-connect the driving thin film transistor T1 by electrically connecting the driving gate electrode G1 to the driving drain electrode D1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, and an emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow a driving voltage ELVDD to be transferred to the organic light-emitting diode OLED. Thus, the driving current IDLED may flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and may initialize the pixel electrode of the organic light-emitting diode OLED.

The first initialization thin film transistor T4 and the second initialization thin film transistor T7 may be connected to the previous scan line SL-1. In an embodiment, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A top electrode Cst2 of the storage capacitor Cst is connected to the driving voltage line PL, and an opposite electrode of the organic light-emitting diode OLED is connected to the common voltage ELVSS. Therefore, the organic light-emitting diode OLED may be configured to receive the driving current $I_{OLED}$ from the driving thin film transistor T1 and emit light to thereby display an image.

Though it is shown in FIG. 5 that the compensation thin film transistor T3 and the first initialization thin film transistor T4 each have a dual gate electrode, the compensation thin film transistor T3 and the first initialization thin film transistor T4 each may have one gate electrode.

Figure 6:
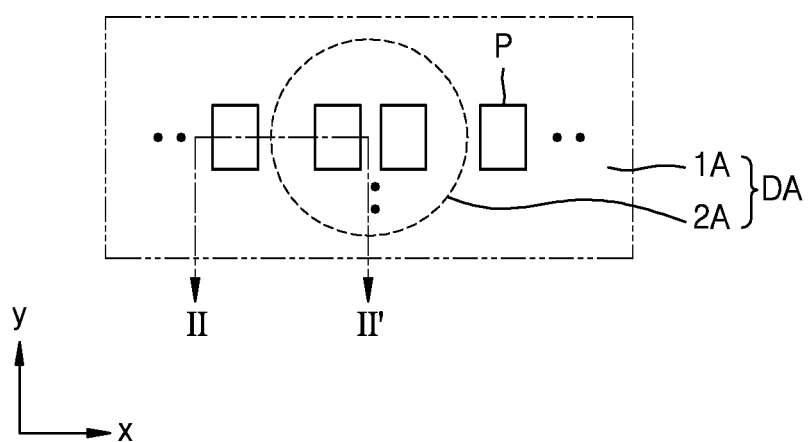
FIG. 6 is an enlarged view of a region V of FIG. 3.
Figure 7:
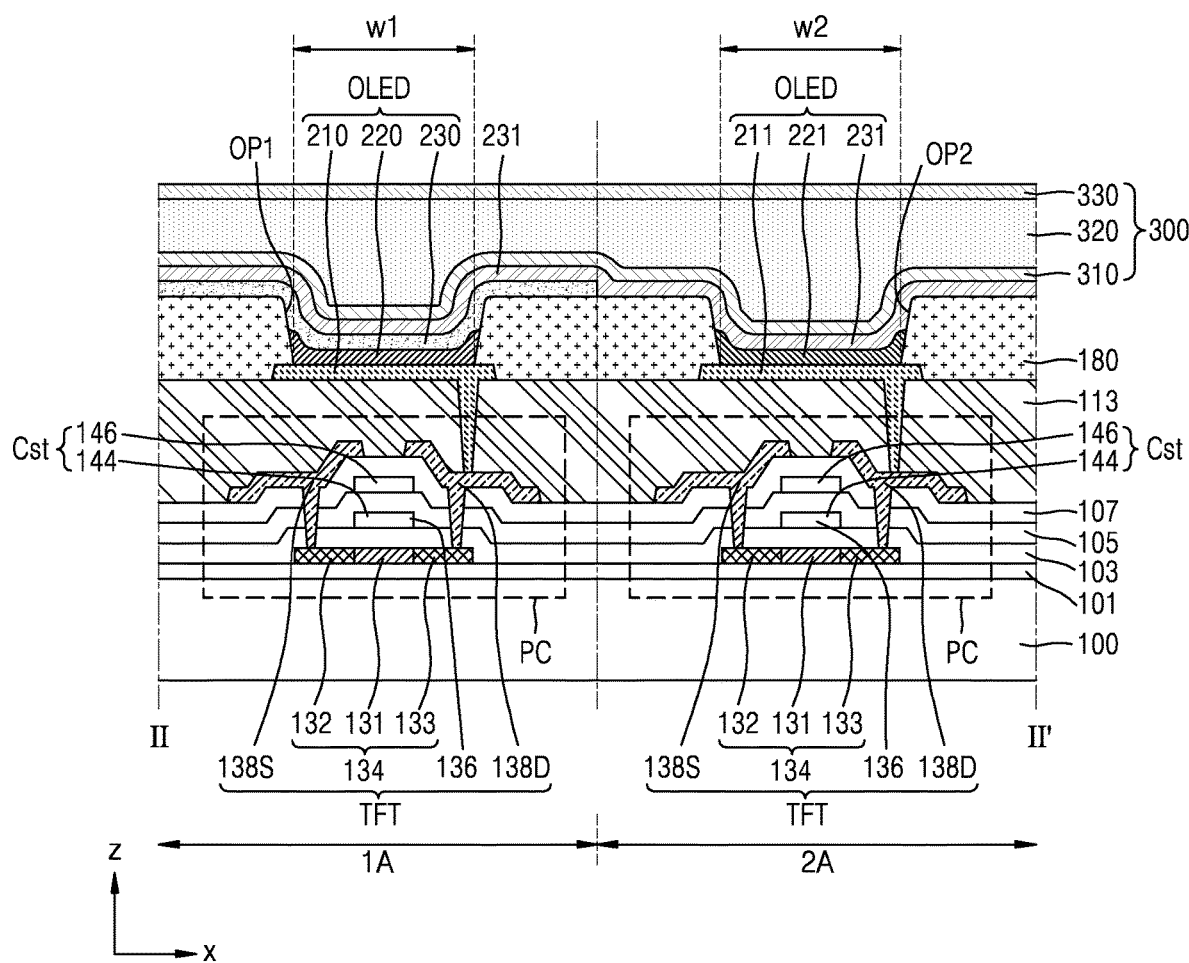
FIG. 7 is a cross-sectional view of a display device according to an embodiment.

FIG. 6 is an enlarged view of a region V of FIG. 3. FIG. 7 corresponds to a cross-sectional view of the display device taken along line II-II' of FIG. 6.

Referring to FIGS. 6 and 7, the pixel circuit PC and the organic light-emitting diode OLED may be arranged in the first area 1A of the substrate 100, abd the organic light-emitting diode OLED is electrically connected to the pixel circuit PC. A pixel circuit PC and an organic light-emitting diode OLED may be arranged in the second area 2A of the substrate 100, the organic light-emitting diode OLED being electrically connected to the pixel circuit PC. Each of the pixel circuits PC arranged in the first area 1A and the second area 2A may include a thin film transistor TFT and a storage capacitor Cst.

A buffer layer 101 located on the substrate 100 may provide a flat surface on the substrate 100 and reduce or block the penetration of foreign substances, moisture, or external air from below the substrate 100. The buffer layer 101 may include an inorganic material such as an oxide or a nitride, an organic material, or an organic/inorganic composite material and include a single layer or a multi-layer including an inorganic material and an organic material. A barrier layer (not shown) blocking the penetration of external air may be further arranged between the substrate 100 and the buffer layer 101.

The thin film transistor TFT may include a semiconductor layer 134, a gate electrode 136, a source electrode 138S, and a drain electrode 138D. The semiconductor layer 134 may include, for example, polycrystalline silicon. The semiconductor layer 134 may include a channel region 131, a source region 132, and a drain region 133, the channel region 131 overlapping the gate electrode 136, and the source region 132 and the drain region 133 being arranged on two opposite sides of the channel region 131 and including impurities having a concentration higher than that of the channel region 131. Here, the impurities may include N-type impurities or P-type impurities. The source region 132 and the drain region 133 may respectively be electrically connected to the source electrode 138S and the drain electrode 138D of the thin film transistor TFT.

The semiconductor layer 134 may include an oxide semiconductor and/or a silicon semiconductor. When the semiconductor layer 134 includes an oxide semiconductor, the semiconductor layer 134 may include an oxide of at least one of, for example, indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include InSnZnO (ITZO), InGaZnO (IGZO), etc. When the semiconductor layer 134 includes a silicon semiconductor, the semiconductor layer 134 may include, for example, amorphous silicon (a-Si) or low temperature polycrystalline silicon (LTPS) in which amorphous silicon (a-Si) is crystallized.

The gate electrode 136 may include a single layer or a multi-layer including at least one metal among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line applying an electric signal to the gate electrode 136.

A first gate insulating layer 103 may be arranged between the semiconductor layer 134 and the gate electrode 136. The first gate insulating layer 103 may include at least one inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). The first gate insulating layer 103 may include a single layer or a multi-layer including the at least one inorganic insulating materials.

The storage capacitor Cst may be arranged on the gate electrode 136. The storage capacitor Cst may include a bottom electrode 144 and a top electrode 146 and overlap the thin film transistor TFT. The bottom electrode 144 of the storage capacitor Cst may be arranged as one body with the gate electrode 136 of the thin film transistor TFT. In an embodiment, the storage capacitor Cst may not overlap the thin film transistor TFT, and the bottom electrode 144 may be an independent element separate from the gate electrode 136 of the thin film transistor TFT.

A second gate insulating layer 105 may be arranged on the gate electrode 136. The second gate insulating layer 105 may include at least one inorganic insulating material among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 105 may include a single layer or a multi-layer including the at least one inorganic insulating materials.

The top electrode 146 of the storage capacitor Cst may be arranged on the second gate insulating layer 105. An interlayer insulating layer 107 may be arranged on the top electrode 146 of the storage capacitor Cst. The interlayer insulating layer 107 may include at least one inorganic insulating material among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 107 may include a single layer or a multi-layer including the at least one inorganic insulating materials.

The source electrode 138S and the drain electrode 138D may be arranged on the interlayer insulating layer 107. The source electrode 138S and the drain electrode 138D may include a conductive material including molybdenum (Mo), aluminum (Al), copper (Cu), and titanium (Ti) and include a single layer or a multi-layer including the above materials. The source electrode 138S and the drain electrode 138D may each include a multi-layered structure of Ti/Al/Ti.

A planarization layer 113 may be arranged on the source electrode 138S and the drain electrode 138D. The planarization layer 113 may include a contact hole. The pixel electrode described below may be electrically connected to the pixel circuit PC through the contact hole.

The planarization layer 113 may planarize a top surface of the pixel circuit PC to planarize a surface on which the organic light-emitting diode OLED is to be located. The planarization layer 113 may include a general-purpose polymer such as benzocyclobutene (BCB), polyimide, hexamethyldisiloxane (HMDSO), polymethyl methacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of the listed materials. The planarization layer 113 may include an inorganic material. The planarization layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). In the case where the planarization layer 113 includes an inorganic material, chemical planarization polishing may be performed depending on a case. The planarization layer 113 may include both an organic material and an inorganic material.

The organic light-emitting diode OLED may be located on the planarization layer 113 in the first area 1A of the substrate 100, the organic light-emitting diode OLED including a first pixel electrode 210, a first intermediate layer 220, and a first opposite electrode 230, the first opposite electrode 230 facing the first pixel electrode 210 with the first intermediate layer 220 therebetween.

An organic light-emitting diode OLED may be located on the planarization layer 113 in the second area 2A of the substrate 100, the organic light-emitting diode OLED including a second pixel electrode 211, a second intermediate layer 221, and a second opposite electrode 231, the second opposite electrode 231 facing the second pixel electrode 211 with the second intermediate layer 221 therebetween.

The first pixel electrode 210 and the second pixel electrode 211 may be arranged on the planarization layer 113. The first pixel electrode 210 and the second pixel electrode 211 may include a (semi) transparent electrode or a reflective electrode. The first pixel electrode 210 and the second pixel electrode 211 may include a reflective layer and a transparent or semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound of the listed elements. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The first pixel electrode 210 may have a stacked structure of ITO/Ag/ITO.

A pixel-defining layer 180 may be arranged on the planarization layer 113. The pixel-defining layer 180 may include a first opening OP1 and a second opening OP2, the first opening OP1 exposing at least a portion of the first pixel electrode 210, and the second opening OP2 exposing at least a portion of the second pixel electrode 211. In an embodiment, the first opening OP1 in the first area 1A may have a first width w1, and the second opening OP2 in the second area 2A may have a second width w2 equal to or less than the first width w1.

The pixel-defining layer 180 may prevent an arc and other issues from occurring at edges of the first pixel electrode 210 by increasing a distance between the edges of the first pixel electrode 210 and the first opposite electrode 230 over the first pixel electrode 210, and prevent an arc from occurring at edges of the second pixel electrode 211 by increasing a distance between the edges of the second pixel electrode 211 and the second opposite electrode 231 over the second pixel electrode 211. The pixel-defining layer 180 may include an organic insulating material such as polyimide, polyamide, an acrylic resin, BCB, HMDSO, and/or a phenolic resin. The pixel-defining layer 180 may be formed by a method such as spin coating.

The first intermediate layer 220 may be arranged on a portion of the first pixel electrode 210 that is exposed by the pixel-defining layer 180, and the second intermediate layer 221 may be arranged on a portion of the second pixel electrode 210 that is exposed by the pixel-defining layer 180. The first intermediate layer 220 and the second intermediate layer 221 may include an emission layer and may further include at least one of a functional layer such as a hole transport layer (HTL), a hole injection layer (HIL), an electron transport layer (ETL), and an electron injection layer (EIL) under and on the emission layer.

The emission layer may include an organic material including a fluorescent or phosphorous material emitting red, green, blue, or white light. The emission layer may include a low molecular weight organic material or a polymer organic material. For example, the emission layer included in the first intermediate layer 220 and the second intermediate layer 221 may include a material emitting green light.

When the emission layer includes a low molecular weight material, the first intermediate layer 220 and the second intermediate layer 221 may have a structure in which an HIL, an HTL, an emission layer (EML), an ETL, an EIL, etc. are stacked in a single or a composite configuration. The first intermediate layer 220 and the second intermediate layer 221 may include, as a low molecular weight material, various organic materials such as copper phthalocyanine (CuPc), N, N'-Di (naphthalene-1-yl)-N, N'-diphenyl-benzidine (NPB), and tris-8-hydroxyquinoline aluminum (Alq3). These layers may be formed by vacuum deposition.

When the emission layer includes a polymer material, the first intermediate layer 220 and the second intermediate layer 221 may have a structure including an HTL and an EML. The HTL may include poly (3,4-ethylenedioxythiophene) (PEDOT), and the EML may include a polymer material such as a polyphenylene vinylene (PPV)-based material and a polyfluorene-based material. The emission layer may be formed by screen printing, inkjet printing, laser induced thermal imaging (LITI), etc.

The first opposite electrode 230 may be arranged on the first intermediate layer 220. The first opposite electrode 230 may be arranged on the first intermediate layer 220 and may entirely cover the first intermediate layer 220. The first opposite electrode 230 may be arranged in the first area 1A over an entire area of the first area 1A. That is, the first opposite electrode 230 may be provided as one contiguous body to cover the plurality of pixels P arranged in the first area 1A. In an embodiment, the first opposite electrode 230 may not be arranged on the second intermediate layer 221 arranged in the second area 2A.

The second opposite electrode 231 may be arranged on the first opposite electrode 230 and the second intermediate layer 221. In an embodiment, the second opposite electrode 231 may be directly arranged on the first opposite electrode 230, that is, in direct contact with the first opposite electrode 230. The second opposite electrode 231 may be arranged in the second area 2A and may extend to the first area 1A and be arranged on an entire surface of the first area 1A and the second area 2A. That is, the second opposite electrode 231 may be provided as one contiguous body to cover the plurality of pixels P arranged in the first area 1A and the plurality of pixels P arranged in the second area 2A. The second opposite electrode 231 may be arranged in direct contact with and electrically connected to the first opposite electrode 230.

The first opposite electrode 230 may include a reflective conductive material. In an embodiment, the first opposite electrode 230 may include a reflective electrode and include a metal thin layer having a small work function and including at least one of lithium (Li), calcium (Ca), lithium fluoride (LiF)/Ca, LiF/aluminum (Al), Al, silver (Ag), magnesium (Mg), and a compound of the listed materials. In an embodiment, a transparent conductive oxide (TCO) layer may be further arranged on the first opposite electrode 230, the TCO layer including ITO, IZO, ZnO, or $In_2O_3$.

The second opposite electrode 231 may be a transparent electrode including a transparent conductive material. In an embodiment, the second opposite electrode 231 may be a transparent or semi-transparent electrode and may include at least one of ITO, IZO, ZnO, $In_2O_3$, IGO, and AZO, which are transparent conductive materials. In an embodiment, the second opposite electrode 231 may include a nanowire and nanoparticles.

Since the second opposite electrode 231 includes a transparent conductive material, a transmittance of the second opposite electrode 231 may be improved by about 60% or more compared to a transmittance of the first opposite electrode 230. In an embodiment, the second opposite electrode 231 may be formed on the surface of the first area 1A and the second area 2A by using a sputter and printing method.

In a comparative example, cutting an area in which a component is arranged by using a laser and making an opening may make the device vulnerable to moisture. Furthermore, there is a non-display area, that is, a dead space provided to accommodate wirings.

To resolve the stated issues, instead of cutting an area in which a component is arranged and making an opening, pixels are arranged even in an area in which a component is arranged (that is, the second area 2A), and a transparent electrode including a transparent conductive material is used to improve a transmittance of the area in which the component is arranged. Therefore, a display in which there is no dead space is achieved.

Figure 8:
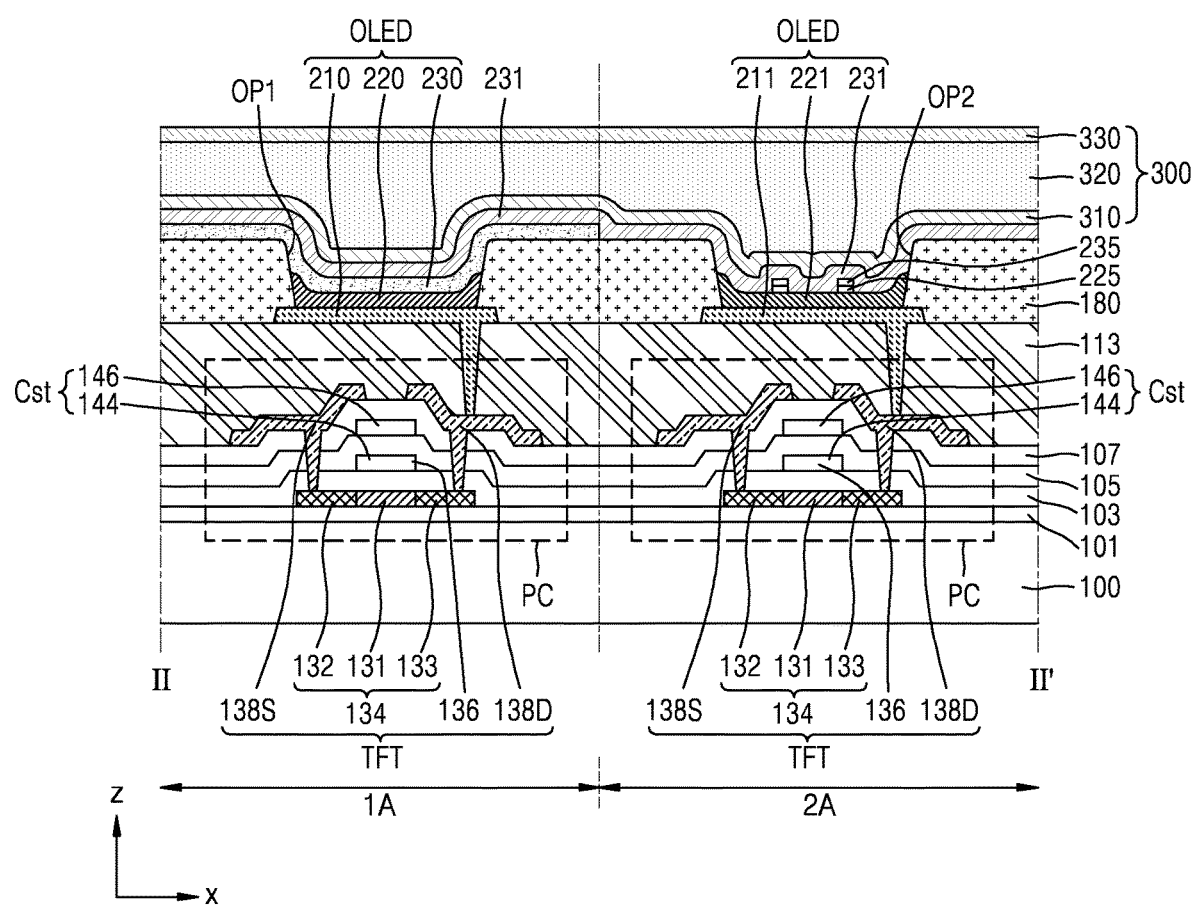
FIG. 8 is a cross-sectional view of a display device according to an embodiment.

FIG. 8 is a cross-sectional view of a display device according to an embodiment.

In FIG. 8, a hydrophobic layer 225 and an island electrode 235 are arranged on the second intermediate layer 221. In FIG. 8, description of the same elements as those of FIG. 7 are omitted.

Referring to FIG. 8, the island electrode 235 may be arranged over the second intermediate layer 221 in the second area 2A, the island electrode 235 exposing at least a portion of the second intermediate layer 221. In an embodiment, the hydrophobic layer 225 may be arranged between the island electrode 235 and the second intermediate layer 221. The hydrophobic layer 225 may include at least one of a fluorine-based material, a perfluorine-based material, and a self assembled monolayer (SAM).

A SAM is an organic assembly formed by adsorption of a molecular structure from solution or a gas phase and may include at least one of alkanethiols, alkylsiloxanes, alkanephosphonic acid, 3,4-dihydroxyphenylethylamine(dopamine), and (3-aminopropyl) trimethoxysilane.

In an embodiment, the second opposite electrode 231 may be arranged on the island electrode 235. The island electrode 235 may not directly contact the first opposite electrode 230. More specifically, the island electrode 235 may be indirectly and electrically connected to the first opposite electrode 230 through the second opposite electrode 231 directly arranged on the island electrode 235.

Figure 9:
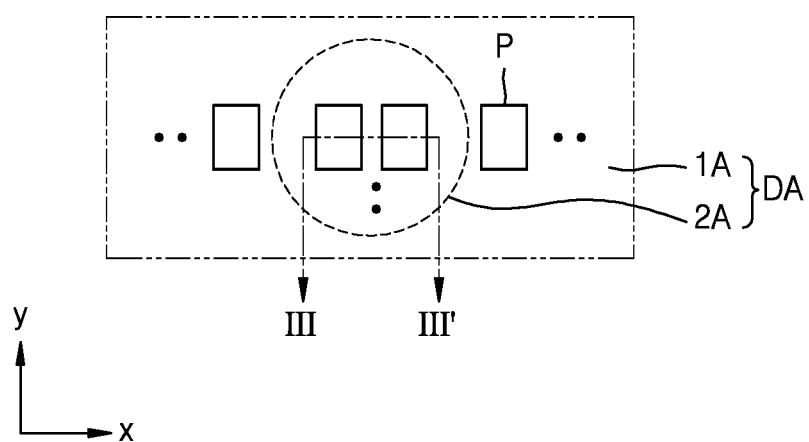
FIG. 9 is an enlarged view of a region V of FIG. 3.
Figure 10:
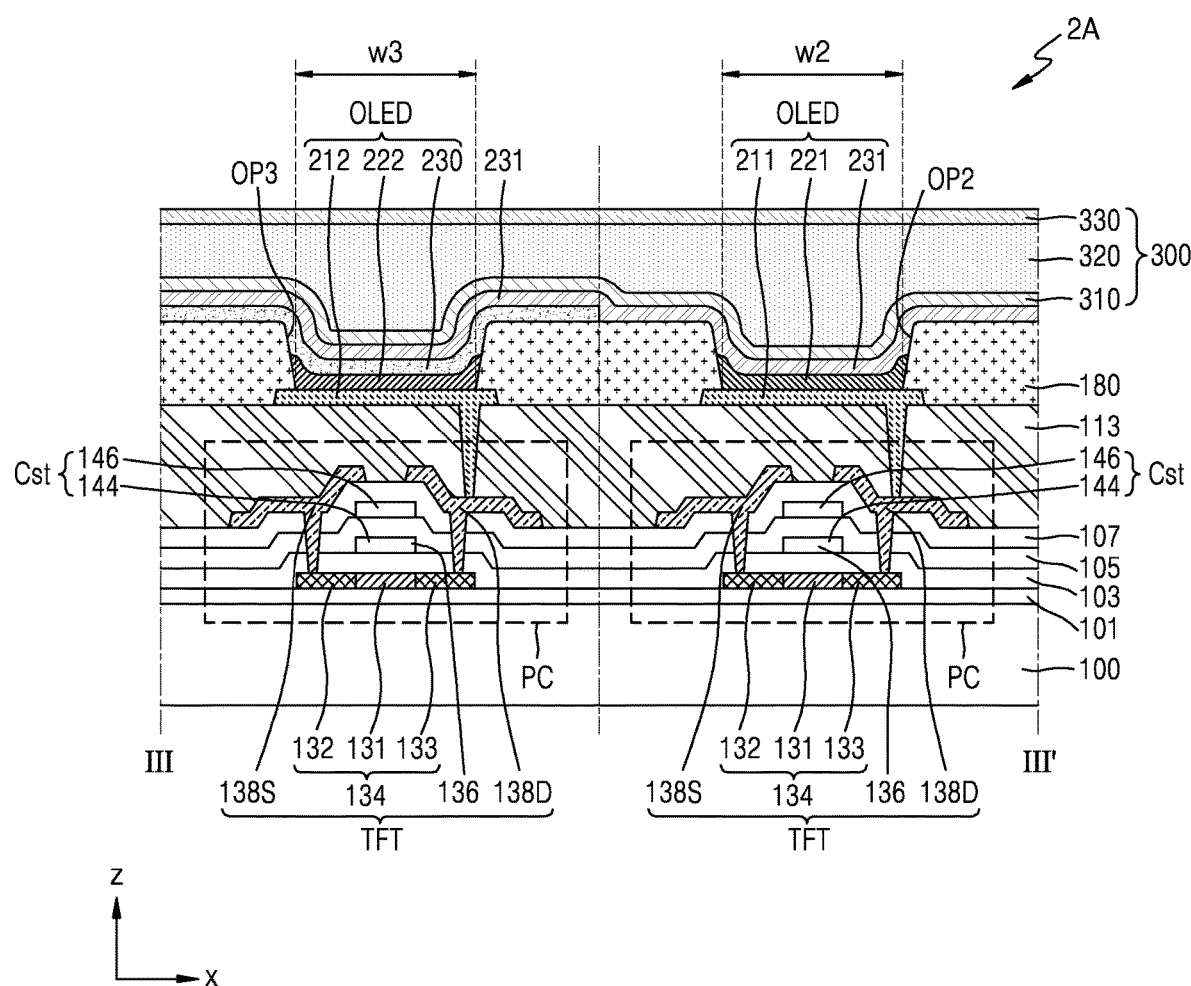
FIG. 10 is a cross-sectional view of a display device according to an embodiment.

FIG. 9 is an enlarged view of a region V of FIG. 3, and FIG. 10 is a cross-sectional view of a display device according to an embodiment.

FIG. 10 illustrates that the first opposite electrode 230 is arranged also in the second area 2A. In FIG. 10, description of the same elements as those of FIG. 7 are omitted.

Referring to FIGS. 9 and 10, in the second area 2A of the substrate 100, an organic light-emitting diode OLED may be located on the planarization layer 113, the organic light-emitting diode OLED including a third pixel electrode 212, a third intermediate layer 222, and the first opposite electrode 230 facing the third pixel electrode 212 with the third intermediate layer 222 between.

The third pixel electrode 212 may be arranged on the planarization layer 113. The third pixel electrode 212 may be a (semi)-transparent electrode or reflective electrode. The third pixel electrode 212 may include a reflective layer and a transparent or (semi)-transparent electrode layer on the reflective layer, the reflective layer including at least one of Ag, Mg, Al, Pt, Pd, Au, Ni, Nd, Ir, Cr, and a compound of the listed elements. The transparent or (semi)-transparent electrode layer may include at least one of ITO, IZO, ZnO, $In_2O_3$, IGO, and AZO. The third pixel electrode 212 may have a stacked structure of ITO/Ag/ITO.

The pixel-defining layer 180 may be arranged on the planarization layer 113 and may include a third opening OP3 exposing at least a portion of the third pixel electrode 212. In an embodiment, the third opening OP3 may have a third width w3 equal to or greater than the second width w2.

The pixel-defining layer 180 may prevent an arc and other issues from occurring at edges of the third pixel electrode 212 by increasing a distance between the edges of the third pixel electrode 212 and the first opposite electrode 230 over the third pixel electrode 212.

The third intermediate layer 222 may be arranged on a portion of the third pixel electrode 212 exposed by the pixel-defining layer 180. The third intermediate layer 222 may include an emission layer and further include at least one of a functional layer such as an HTL, an HIL, an ETL, and an EIL under and on the emission layer.

The first opposite electrode 230 may be arranged on the third intermediate layer 222. More specifically, at least a portion of the first opposite electrode 230 arranged in the first area 1A and arranged on the entire surface of the first area 1A may extend toward the second area 2A and be arranged on the third intermediate layer 222.

Since the first opposite electrode 230 arranged in the first area 1A extends toward the second area 2A, a transmittance of the second area 2A and an emission efficiency of the second area 2A may be improved.

The second opposite electrode 231 may be arranged on the first opposite electrode 230 extending toward the second area 2A. The second opposite electrode 231 may be arranged directly on the first opposite electrode 230 and thus electrically connected to the first opposite electrode 230.

FIGS. 11A to 11E are cross-sectional views of a process of manufacturing the display device 1 according to an embodiment.

A method of manufacturing the display device 1 is sequentially described below with reference to FIGS. 11A to 11E.

Figure 11A:
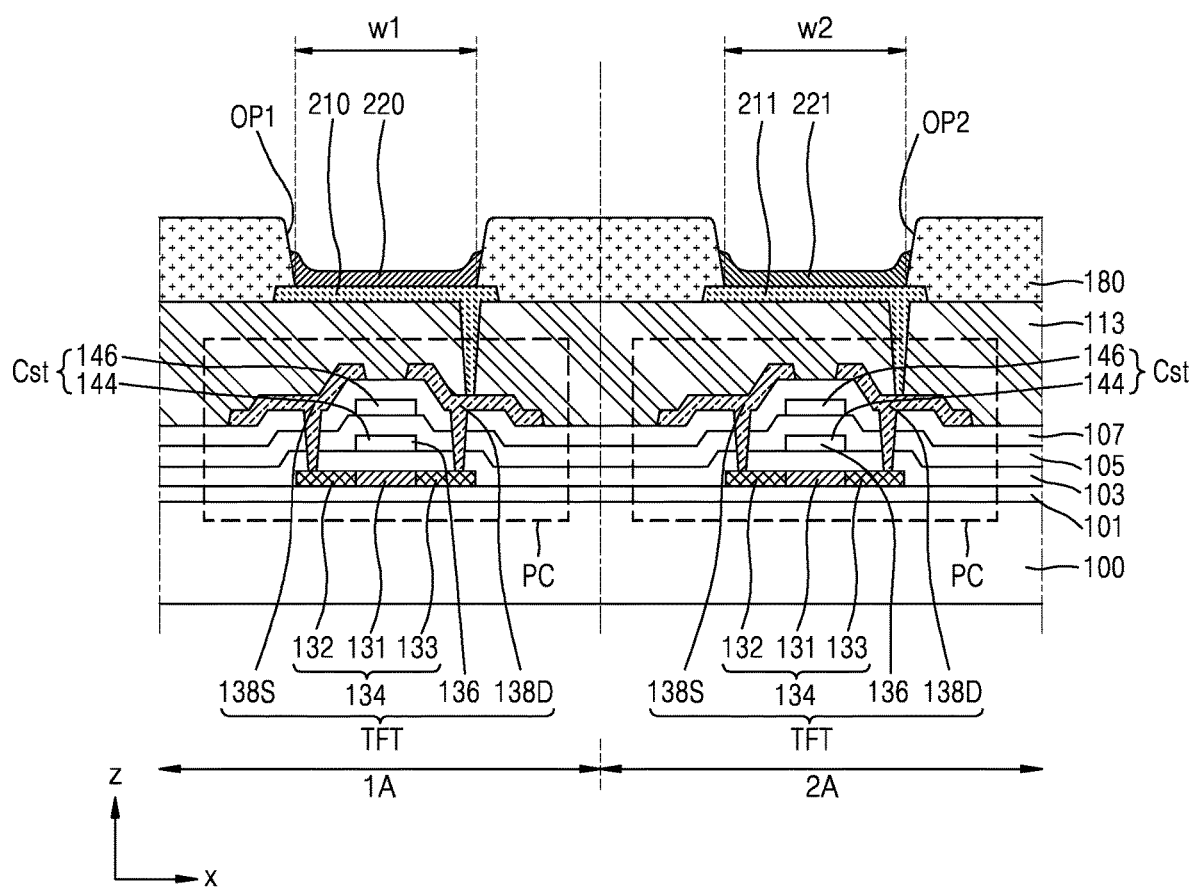
FIGS. 11A, 11B, 11C, 11D, and 11E are cross-sectional views of some of a process of manufacturing a display device according to an embodiment.

First, referring to FIG. 11A, the method includes preparing the substrate 100 in which the display area DA is defined, by forming the first pixel electrode 210 in the first area 1A and forming the second pixel electrode 211 in the second area 2A. The pixel-defining layer 180 is formed including the first opening OP1 and the second opening OP2 on the first pixel electrode 210, the first opening OP1 exposing at least a portion of the first pixel electrode 210, and the second opening OP2 exposing at least a portion of the second pixel electrode 211. The first intermediate layer 220 is formed on the at least a portion of the first pixel electrode 210 and the second intermediate layer 221 formed on the at least a portion of the second pixel electrode 211.

The display area DA including the first area 1A and the second area 2A may be defined in the substrate 100. Referring to FIG. 11A, the buffer layer 101, the first gate insulating layer 103, the second gate insulating layer 105, the interlayer insulating layer 107, and the planarization layer 113 may be arranged on the substrate 100. In an embodiment, the thin film transistor TFT and the storage capacitor Cst may be arranged over the substrate 100, the thin film transistor TFT including the semiconductor layer 134, the gate electrode 136, the source electrode 138S, and the drain electrode 138D, and the storage capacitor Cst including the bottom electrode 144 and the top electrode 146.

The first pixel electrode 210 may be formed in the first area 1A, and the second pixel electrode 211 may be formed in the second area 2A. The pixel-defining layer 180 including the first opening OP1 and the second opening OP2 may be formed on the first pixel electrode 210 and the second pixel electrode 221. The first opening OP1 exposes at least a portion of the first pixel electrode 210, and the second opening OP2 exposes at least a portion of the second pixel electrode 211. The first intermediate layer 220 may be formed on at least a portion of the first pixel electrode 210 exposed by the pixel-defining layer 180, and the second intermediate layer 221 may be formed on at least a portion of the second pixel electrode 211 exposed by the pixel-defining layer 180.

The first opening OP1 may have the first width w1, and the second opening OP2 may have the second width w2 equal to or less than the first width w1.

Figure 11B:
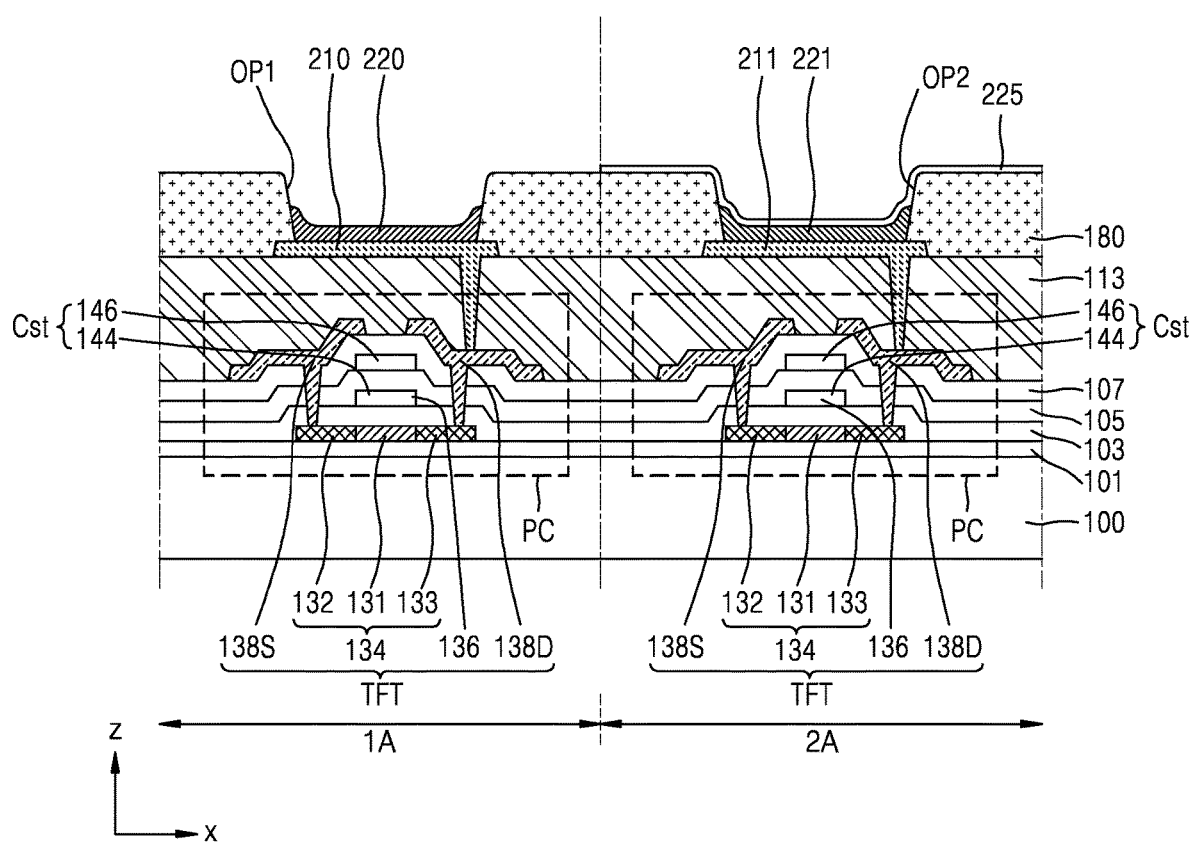

Referring to FIG. 11B, the method may further include forming the hydrophobic layer 225 on the second intermediate layer 221. The hydrophobic layer 225 may be formed on the entire surface of the second area 2A, the hydrophobic layer 225 including at least one of a fluorine-based material, a perfluorine-based material, and a self assembled monolayer (SAM).

Figure 11C:
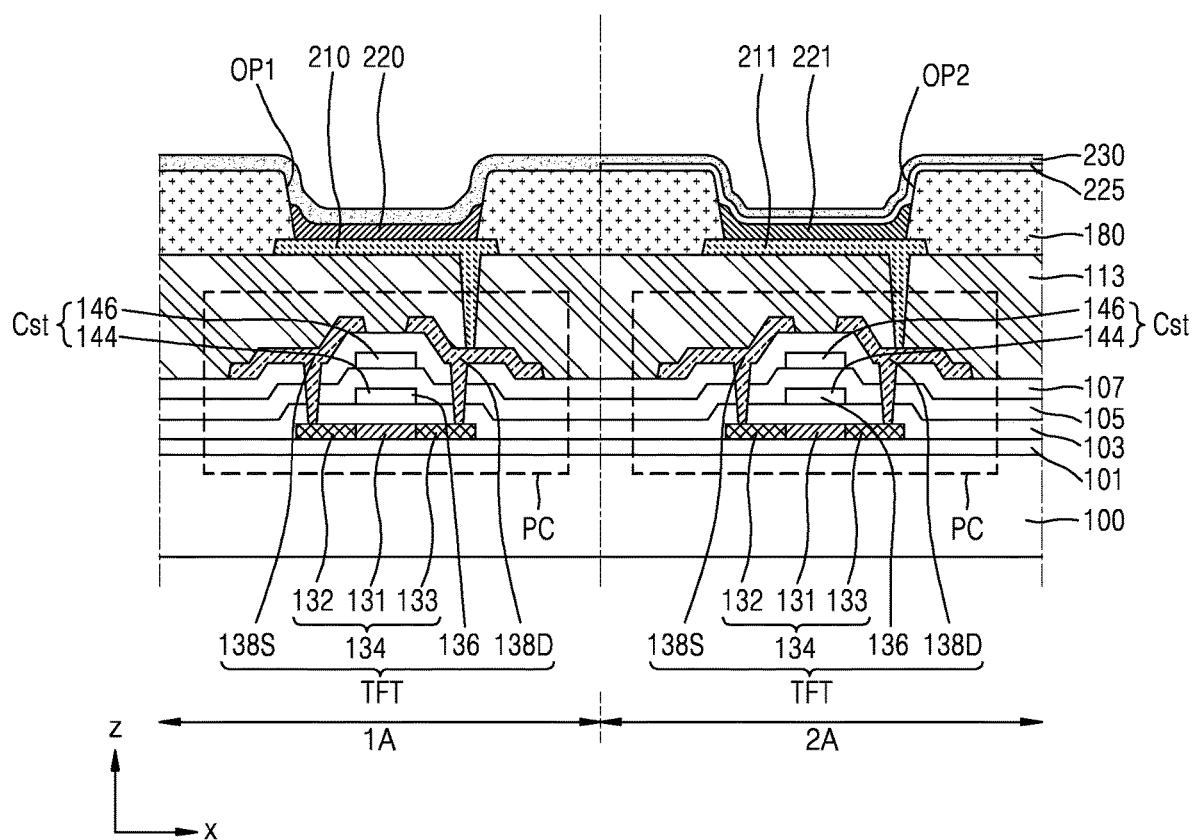

Referring to FIG. 11C, the method may further include forming the first opposite electrode 230 on the first intermediate layer 220 and the hydrophobic layer 225. The first opposite electrode 230 may be entirely formed over the first area 1A and the second area 2A of the substrate 100.

Generally, an organic material or a metal material is not formed smoothly on a material having low surface energy. In an embodiment, the first opposite electrode 230 may not be formed smoothly on the hydrophobic layer 225 by a SAM, which has low surface energy, as the hydrophobic layer 225. The portion of the first opposite electrode 230 in the second area 2A may be formed thinner than the portion of the first opposite electrode 230 in the first area 1A. In an embodiment, the first opposite electrodes 230 in the second area 2A may be apart from each other and be formed on the hydrophobic layer 225.

Figure 12:
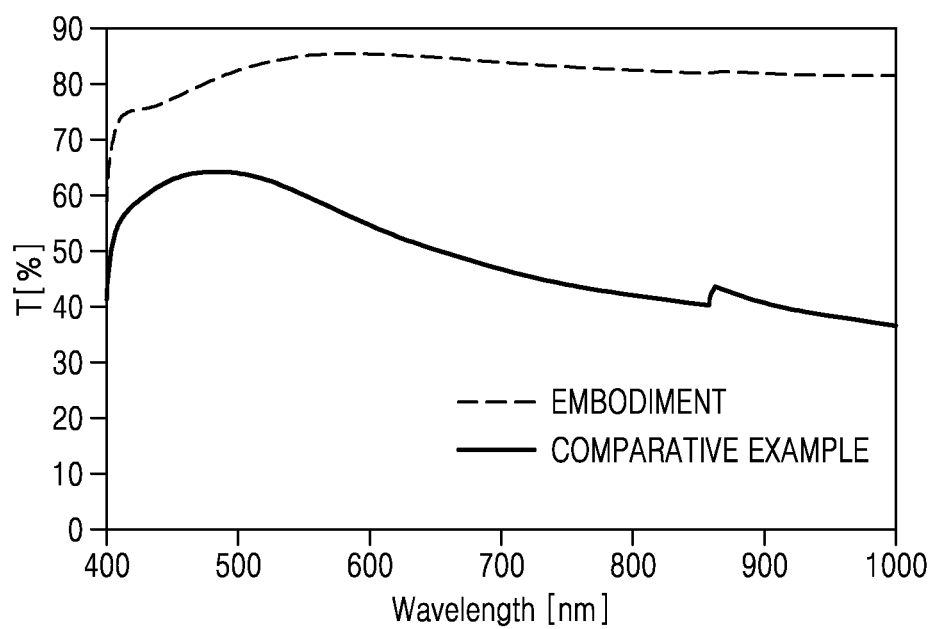
FIG. 12 is a view of a transmittance graph depending on a wavelength in an embodiment and a comparative example.

FIG. 12 is a view of a transmittance graph depending on a wavelength in an embodiment of the present disclosure and a comparative example. More specifically, FIG. 12 is a transmittance graph depending on a wavelength in the embodiment in which the intermediate layer and the opposite electrode are formed on an SAM, and the comparative example in which the intermediate layer and the opposite electrode are formed on a substrate.

Referring to FIG. 12, the transmittance of the embodiment is higher than the transmittance of the comparative example in all wavelength bands. Accordingly, when the hydrophobic layer 225 is formed by using a self assembled monolayer (SAM), the opposite electrode is not formed on the hydrophobic layer 225.

Figure 11D:
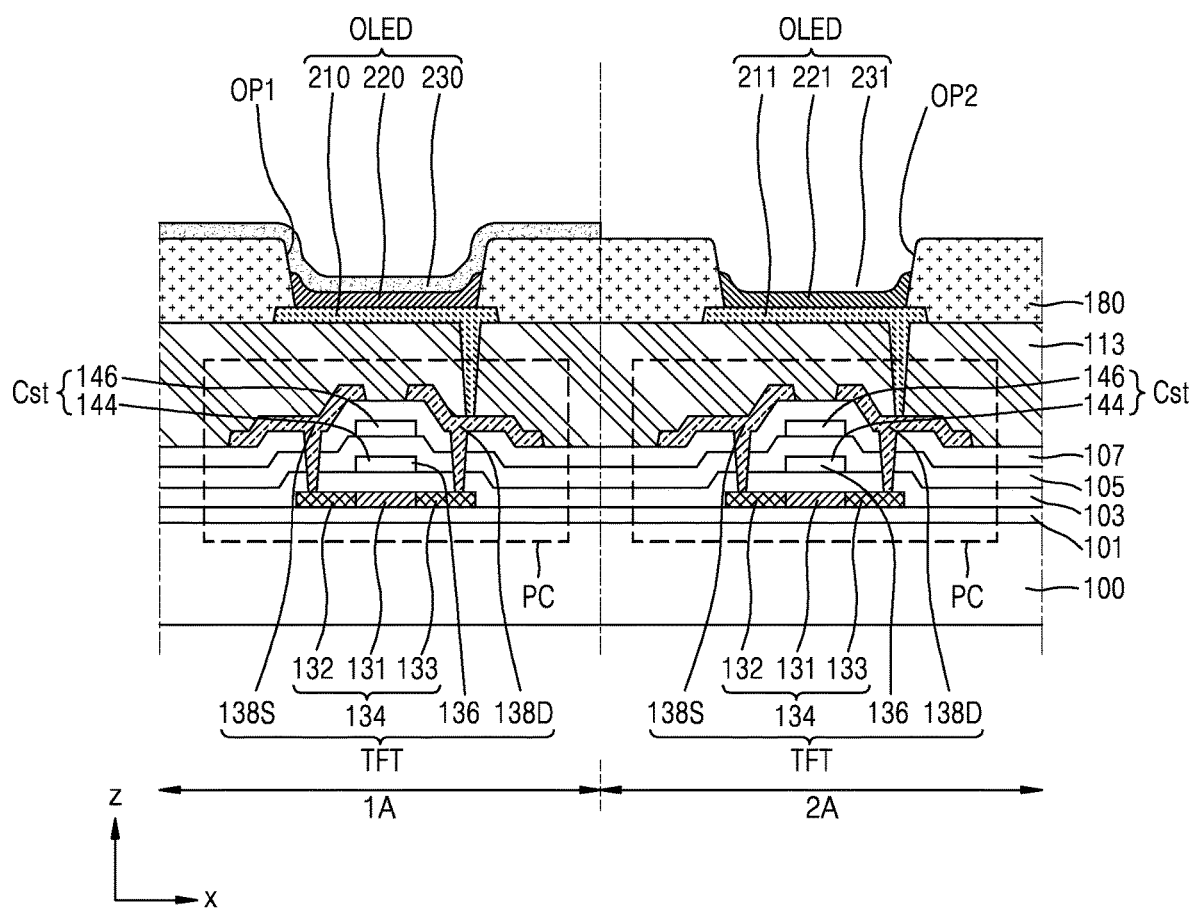

Referring to FIG. 11D, the method may further include removing the hydrophobic layer 225 formed on the second intermediate layer 221, and the first opposite electrode 230 formed on the hydrophobic layer 225.

The hydrophobic layer 225 formed on the second intermediate layer 221, and the first opposite electrode 230 formed on the hydrophobic layer 225 may be removed by plasma used during a process of forming the second opposite electrode 231 described below. Since the first opposite electrode 230 arranged on the second intermediate layer 221 is removed by plasma, the first opposite electrode 230 may not be arranged on the second intermediate layer 221. In an embodiment, the hydrophobic layer 225 and the first opposite electrode 230 may be arranged on the second intermediate layer 221 with at least a portion of the hydrophobic layer 225 on the second intermediate layer 221, and at least a portion of the first opposite electrode 230 on the hydrophobic layer 225 not removed. The first opposite electrode 230 that is not removed by plasma may be the island electrode 235.

Figure 11E:
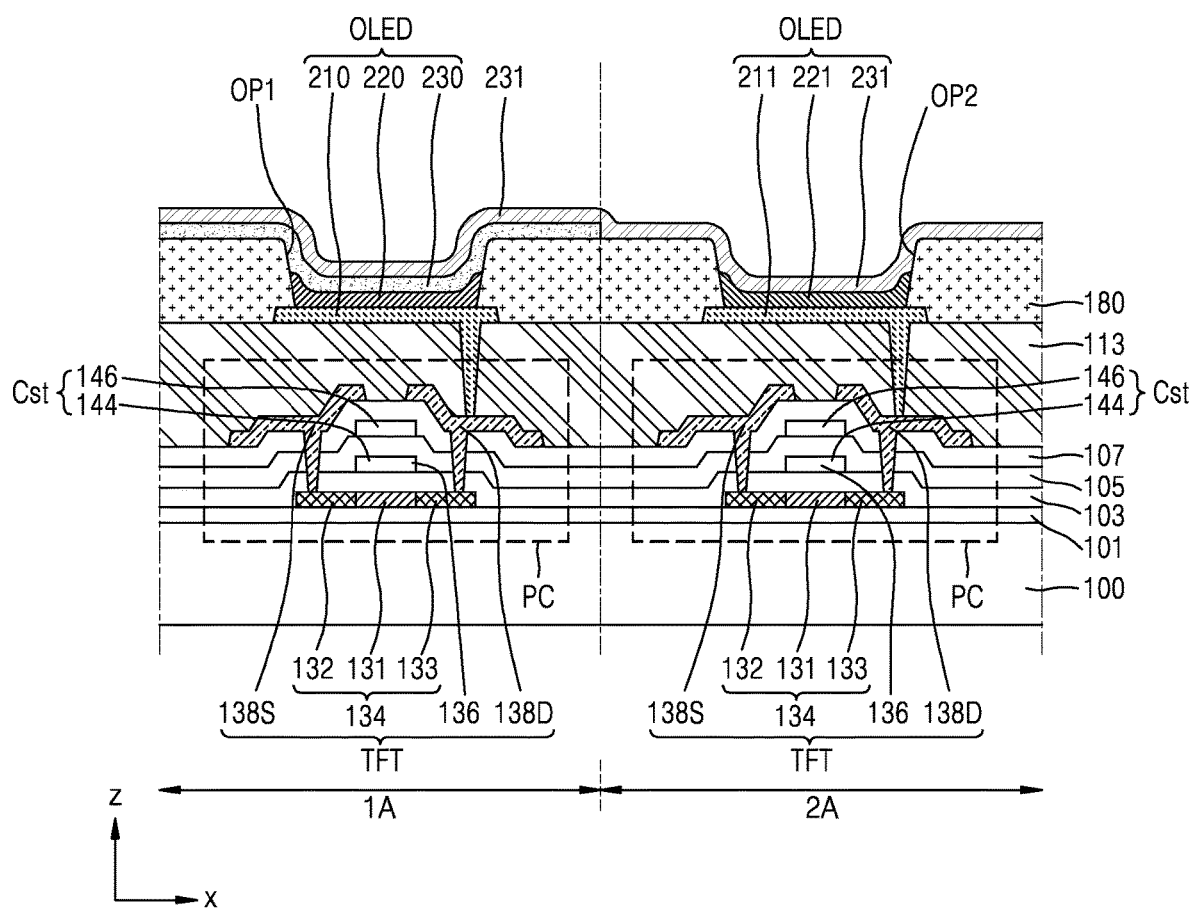

Referring to FIG. 11E, the method may further include forming the second opposite electrode 231 on the first opposite electrode 230 and the second intermediate layer 221. That is, the second opposite electrode 231 may be formed as one body to cover the plurality of pixels P arranged in the first area 1A and the plurality of pixels P arranged in the second area 2A. The second opposite electrode 231 may be arranged directly on the first opposite electrode 230 and thus electrically connected to the first opposite electrode 230. In an embodiment, the second opposite electrode 231 may include a transparent conductive material, and the transparent conductive material may include at least one of ITO, IZO, ZnO, $In_2O_3$, IGO, and AZO.

According to an embodiment, pixels are arranged in the second area 2A in which an optical element, etc. are arranged, and the opposite electrode including a transparent conductive material is arranged by using the hydrophobic layer. Therefore, the transmittance of the second area 2A may be improved, and simultaneously, a display device having an improved product reliability, and a method of manufacturing the display device may be provided.

According to an embodiment, since pixels are arranged in an area in which an electronic element such as an optical element or a sensor is arranged by using a hydrophobic layer, a display device having a reduced dead space and an improved product reliability may be implemented. However, the scope of the present disclosure is not limited by this effect.

Embodiments described herein are illustrative. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method including:
   preparing a substrate including a display area, the display area including a first area and a second area;
   forming a first pixel electrode in the first area, and a second pixel electrode in the second area;
   forming a pixel-defining layer including a first opening and a second opening, the first opening being in the first pixel electrode and exposing at least a portion of the first pixel electrode, and the second opening being in the second pixel electrode and exposing at least a portion of the second pixel electrode;
   forming a first intermediate layer on the at least a portion of the first pixel electrode, and a second intermediate layer on the at least a portion of the second pixel electrode;
   forming a hydrophobic layer on the second intermediate layer;
   forming a first opposite electrode on the first intermediate layer and the hydrophobic layer;
   removing the hydrophobic layer and the first opposite electrode on the hydrophobic layer; and
   forming a second opposite electrode on the first opposite electrode and the second intermediate layer.

2. The method of claim 1, wherein the second opposite electrode includes a transparent conductive material.

3. The method of claim 2, wherein the transparent conductive material includes at least one of indium tin oxide (ITO), indium zinc oxide (IZO), zinc oxide (ZnO), indium oxide (In2O3), indium gallium oxide (IGO), and aluminum zinc oxide (AZO).

4. The method of claim 1, wherein the forming of the second opposite electrode on the first opposite electrode includes forming the second opposite electrode directly on the first opposite electrode.

5. The method of claim 1, wherein, in the forming of the pixel-defining layer including the first opening and the second opening, the first opening has a first width, and the second opening has a second width, the second width being less than or equal to the first width.

6. The method of claim 1, wherein the first opposite electrode is not arranged on the second intermediate layer.

* * * * *